United States Patent
Ku et al.

(10) Patent No.: US 7,872,508 B2
(45) Date of Patent: Jan. 18, 2011

(54) DELAY LOCKED LOOP CIRCUIT

(75) Inventors: Young-Jun Ku, Gyeonggi-do (KR);
Ki-Ho Kim, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 0 days.

(21) Appl. No.: 12/488,901

(22) Filed: Jun. 22, 2009

(65) Prior Publication Data

US 2010/0134164 A1 Jun. 3, 2010

(30) Foreign Application Priority Data

Dec. 2, 2008 (KR) ...................... 10-2008-0121233

(51) Int. Cl.
*H03L 7/06* (2006.01)
(52) U.S. Cl. ...................... 327/158; 327/149
(58) Field of Classification Search ................. 327/149, 327/158
See application file for complete search history.

(56) References Cited

U.S. PATENT DOCUMENTS

| | | | |
|---|---|---|---|
| 6,784,707 B2 | 8/2004 | Kim et al. | |
| 6,985,401 B2* | 1/2006 | Jang et al. | 365/194 |
| 7,061,287 B2* | 6/2006 | Jeon | 327/149 |
| 7,103,133 B2 | 9/2006 | Jung | |
| 7,667,510 B2* | 2/2010 | Shim et al. | 327/158 |
| 7,719,342 B2* | 5/2010 | Jeong | 327/525 |
| 7,778,095 B2* | 8/2010 | Na | 365/194 |
| 7,782,105 B2* | 8/2010 | Lee et al. | 327/158 |
| 2007/0097773 A1 | 5/2007 | Nishioka et al. | |
| 2008/0205186 A1 | 8/2008 | Kim et al. | |
| 2009/0116299 A1 | 5/2009 | Shin et al. | |
| 2009/0273380 A1* | 11/2009 | Shim et al. | 327/158 |
| 2010/0074037 A1* | 3/2010 | Lin | 365/194 |
| 2010/0090736 A1* | 4/2010 | Kim et al. | 327/158 |
| 2010/0214858 A1* | 8/2010 | Kang et al. | 365/193 |

FOREIGN PATENT DOCUMENTS

JP 2007-095283 4/2007

* cited by examiner

*Primary Examiner*—Lincoln Donovan
*Assistant Examiner*—Adam D Houston
(74) *Attorney, Agent, or Firm*—IP & T Group LLP

(57) ABSTRACT

A delay locked loop circuit includes a delay locking block configured to delay an input clock and output the delayed input clock as an internal clock to compensate a skew of an external clock and the internal clock, a pulse generating block configured to sequentially output a plurality of pulse signals that control an operation of the delay locking block and enable one of the plurality of pulse signals in response to a detection signal, wherein the plurality of pulse signals is shifted by being synchronized with the input clock, and a pulse detecting block configured to output the detection signal in case all of the plurality of pulse signals are disabled.

17 Claims, 10 Drawing Sheets

US 7,872,508 B2

DELAY LOCKED LOOP CIRCUIT

CROSS-REFERENCE TO RELATED APPLICATIONS

The present invention claims priority of Korean patent application number 10-2008-0121233, filed on Dec. 2, 2008, the disclosure of which is incorporated herein by reference in its entirety.

BACKGROUND OF THE INVENTION

The present invention relates to a delay locked loop circuit, and more particularly, to a delay locked loop circuit capable of preventing the malfunction due to the glitch of a clock.

FIG. 1 illustrates a block diagram of a conventional delay locked loop circuit having a single loop structure.

As shown in FIG. 1, the conventional delay locked loop circuit having the single loop structure may include a clock buffering block 101, a phase comparing block 103, a delaying block 105, a replica modeling block 107 and a pulse generating block 109.

The clock buffering block 101 outputs an input clock REF_CLK by buffering an external clock EXT_CLK. The clock buffering block 101 is inactivated in response to a buffer control signal BUF_EN that is enabled when the delay locked loop circuit enters a power down mode and, at this time, the input clock REF_CLK is disabled. The clock being disabled means that the clock is not toggled.

The phase comparing block 103 compares the input clock REF_CLK with a feedback clock FB_CLK outputted from the replica modeling block 107 and outputs a phase comparison signal CMP including information for a phase difference of the input clock REF_CLK and the feedback clock FB_CLK to the delaying block 105, wherein the feedback clock FB_CLK is obtained by modeling components of delaying a clock inside a semiconductor memory device.

The delaying block 105 determines a delay amount in response to the phase comparison signal CMP and outputs an internal clock CLK_OUT by delaying the input clock REF_CLK by the delay amount.

The internal clock CLK_OUT is coupled to the replica modeling block 107. If the phase of the input clock REF_CLK is consistent with that of the feedback clock FB_CLK through the above process, i.e., the delay locking, locking is achieved.

The pulse generating block 109 generates a plurality of pulse signals P_1 to P_N enabled by being synchronized with the input clock REF_CLK to control operations of the phase comparing block 103 and the delaying block 105. Namely, the phase comparing block 103 and the delaying block 105 are enabled in response to a part or all of the pulse signals P_1 to P_N. To perform the delay locking operation, a sequence of operations such as the operation of comparing the phases and the operation of delaying the input clock REF_CLK should be sequentially performed in combination with a clock. The pulse generating block 109 controls the delay locking operation to be sequentially performed.

For instance, the pulse generating block 109 generates a first pulse signal to a twelfth pulse signal, P_1 to P_12, and the phase comparing block 103 is activated in response to the second pulse signal P_2 to output the phase comparison signal CMP. The delaying block 105 is activated in response to the sixth pulse signal P_6 that is enabled after the second pulse signal P_2 is enabled, thereby delaying the input clock REF_CLK. The number or kind of the pulse signals used in the phase comparing block 103 and the delaying block 105 may be changed according to the constitution of the phase comparing block 103 and the delaying block 105. For example, in case the delaying block 105 performs a coarse delay operation and a fine delay operation, the coarse delay operation may be performed in response to the sixth pulse signal P_6 and the fine delay operation may be performed in response to the ninth pulse signal P_9. Furthermore, the number or kind of the pulse signals may be changed according to the constitution of the delay locked loop circuit. The pulse generating block 109 will be described in detail with reference to FIG. 3.

FIG. 2 illustrates a block diagram of a conventional delay locked loop circuit having a dual loop structure.

Referring to FIG. 2, the conventional delay locked loop circuit having the dual loop structure includes a clock buffering block 201, a first delay locking block 203, a second delay locking block 205, a duty rate correcting block 207 and a pulse generating block 209.

The construction and operations of the clock buffering block 201 and the pulse generating block 209 are similar to those of the clock buffering block 101 and the pulse generating block 109 in FIG. 1. Each of the first and the second delay locking blocks 203 and 205 includes a phase comparing sector, a delaying sector and a replica modeling sector like the construction of the delay locked loop circuit in FIG. 1 and is controlled by a plurality of pulse signals P_1 to P_N generated by the pulse generating block 209. Since the second delay locking block 205 inverts an input clock REF_CLK and outputs an inverted input clock in connection with a duty rate correcting operation performed in the duty rate correcting block 207, a phase of a rising edge of a first internal clock CLK_OUT1 is consistent with that of a second internal clock CLK_OUT2 and a duty rate of the first internal clock CLK_OUT1 is opposite to that of the second internal clock CLK_OUT2.

The duty rate correcting block 207 corrects duty rates of the first and second internal clocks CLK_OUT1 and CLK_OUT2 by combining the phases of the first and second internal clocks CLK_OUT1 and CLK_OUT2, thereby outputting a first and a second corrected clock CLK_CC1 and CLK_CC2. As described above, since the phase of the rising edge of the first internal clock CLK_OUT1 is consistent with that of the second internal clock CLK_OUT2, the duty rate correcting block 207 combines phases of falling edges of the first and second internal clocks CLK_OUT1 and CLK_OUT2.

FIG. 3 illustrates a detailed circuit diagram of the pulse generating block 109, 209 described in FIGS. 1 and 2.

Referring to FIG. 3, the pulse generating block 109, 209 includes a shift register 301 and a pulse control sector 315.

The shift register 301 shifts a pulse control signal START by synchronizing the pulse control signal START outputted from the pulse control sector 315 with the input clock REF_CLK, and generates the plurality of pulse signals P_1 to P_12 that are sequentially enabled. The shift register 301 includes a first to a twelfth flip-flop 303 to 314 serially connected to each other, wherein each of the first to twelfth flip-flops 303 to 314 shifts its input signal by one period of the input clock REF_CLK to output a corresponding one of the plurality of pulse signals P_1 to P_12.

The pulse control sector 315 detects a period of the first to twelfth pulse signals P_1 to P_12 and enables the pulse control signal START for every period.

The first flip-flop 303 outputs the first pulse signal P_1 that is enabled at a high level by synchronizing the pulse control signal START enabled at a high level with a rising edge of the input clock REF_CLK. The first pulse signal P_1 is inputted to the second flip-flop 304. The second flip-flop 304 generates the second pulse signal P_2 that is enabled as being delayed by one period of the input clock REF_CLK from the first pulse signal P_1. Similarly, the third to the twelfth flip-flops 305 to 314 shift output signals of their previous flip-flops by one period of the input clock REF_CLK and output the shifted signals as the third to twelfth pulse signals P_3 to P_12 that are sequentially enabled.

The pulse control sector 315 enables the pulse control signal START in response to the twelfth pulse signal P_12 and disables the pulse control signal START in response to the first pulse signal P_1. Therefore, the first flip-flop 303 enables the first pulse signal P_1 again in response to the pulse control signal START and the pulse signals P_1 to P_12 become pulse signals having a predetermined period. The pulse signals inputted to the pulse control sector 315 can be changed and the period of the first to the twelfth pulse signals can be adjusted according to the pulse signals inputted to the pulse control sector 315. For instance, if the pulse control signal START is enabled in response to the sixth pulse signal P_6, the period of the first to twelfth pulse signals P_1 to P_12 becomes shorter.

The pulse control sector 315 includes an OR gate 317, an SR latch 319 and a NOR gate 321. An output signal of the OR gate 317 receiving the twelfth pulse signal P_12 and a reset signal RESET is inputted to an input node R of the SR latch 319. The first pulse signal P_1 is inputted to an input node S of the SR latch 319. Since the first and twelfth pulse signals P_1 and P_12 are disabled at a low level before the reset signal RESET is disabled, the reset signal RESET is inputted to the OR gate 317 so as to establish an initial value of the SR latch 319 and enable the pulse control signal START in the early stage of the operation.

The SR latch 319 makes a logic level of an A node being a low level in response to the twelfth pulse signal P_12 and a logic level of the A node being a high level in response to the first pulse signal P_1. The SR latch 319 maintains the logic level of the A node at the high level while the first pulse signal P_1 and the twelfth pulse signal P_12 are disabled.

If the reset signal RESET is changed from an enabled state having a high level to a disabled state having a low level, the logic level of the A node is maintained at the low level by the SR latch 319. The pulse control signal START is enabled at a high level after the reset signal RESET is disabled at the low level by the NOR gate 321 receiving the reset signal RESET. The first pulse signal P_1 is enabled at a high level in response to the pulse control signal START that is enabled.

FIGS. 4A and 4B illustrate timing diagrams for the pulse generating block 109, 209 described in FIG. 3. FIG. 4A illustrates a timing diagram for the pulse generating block 109, 209 in a normal mode. FIG. 4B illustrates a timing diagram for the pulse generating block 109, 209 during the delay locked loop circuit coming out of a power down mode after it enters the power down mode.

Referring to FIG. 4A, if the reset signal RESET is disabled at the low level from the high level, the pulse control signal START is enabled at the high level by the pulse control sector 315. The shift register 301 is synchronized with the input clock REF_CLK in response to the pulse control signal START and generates the plurality of pulse signals P_1 to P_12 that are sequentially enabled. The pulse control sector 315 outputs the pulse control signal START that is enabled in response to the twelfth pulse signal P_12 and disabled in response to the first pulse signal P_1.

Referring to FIG. 4B, the input clock REF_CLK is disabled when the delay locked loop circuit enters the power down mode and enabled again when the delay locked loop circuit exits from the power down mode. In case the delay locked loop circuit enters the power down mode after the first pulse signal P_1 is enabled, the enabled state of the first pulse signal P_1 is maintained as the input clock REF_CLK is disabled. Then, in case the delay locked loop circuit exits from the power down mode, the glitch may occur in the input clock REF_CLK. Since the operation of the shift register 301 becomes unstable due to the glitch, the first flip-flop 303 disables the first pulse signal P_1 in response to the glitch and the second pulse signal P_2 is not enabled in case the second flip-flop 304 does not respond to the glitch. Therefore, the shift register 301 does not enable the pulse signals anymore.

After all, in the conventional delay locked loop circuit, in case a certain pulse signal is disabled by external noise or the glitch of the clock that can occur when the delay locked loop circuit exits from the power down mode, the shift register 301 does not enable the pulse signals P_1 to P_12 sequentially and thus the delay locked loop circuit operating in response to the plurality of pulse signals P_1 to P_12 may not perform its operation.

SUMMARY OF THE INVENTION

Embodiments of the present invention are directed to providing a delay locked loop circuit capable of preventing the mal-operation due to the glitch of a clock.

In accordance with an aspect of the present invention, there is provided a delay locked loop circuit including: a delay locking block configured to delay an input clock and output the delayed input clock as an internal clock to compensate a skew of an external clock and the internal clock; a pulse generating block configured to sequentially output a plurality of pulse signals that controls an operation of the delay locking block and enable one of the plurality of pulse signals in response to a detection signal, wherein the plurality of pulse signals is shifted by being synchronized with the input clock; and a pulse detecting block configured to output the detection signal in case all of the plurality of pulse signals are disabled.

The pulse detecting block may include a detecting sector configured to detect whether the plurality of pulse signals are disabled or not, and an enabling sector configured to enable the detection signal for a certain period according to the detection result of the detecting sector.

The pulse generating block may include a shift register configured to generate the plurality of pulse signals by shifting a pulse control signal, and a pulse control sector configured to enable the pulse control signal for every period of the plurality of pulse signals and enable the pulse control signal regardless of the period of the plurality of pulse signals in case the detection signal is disabled after the certain period.

In accordance with an aspect of the present invention, there is provided a delay locked loop circuit including a delay locking block configured to delay an input clock and output the delayed input clock as an internal clock; a pulse generating block comprising a shift register and configured to sequentially output a plurality of pulse signals that are shifted in the shift register and control an operation of the delay locking block, wherein a pulse signal of the plurality of pulse signals is enabled in response to a detection signal; and a pulse detecting block configured to output the detection signal when all of the plurality of pulse signals are disabled.

DESCRIPTION OF SPECIFIC EMBODIMENTS

Other objects and advantages of the present invention can be understood by the following description, and become apparent with reference to the embodiments of the present invention.

Figure 1:
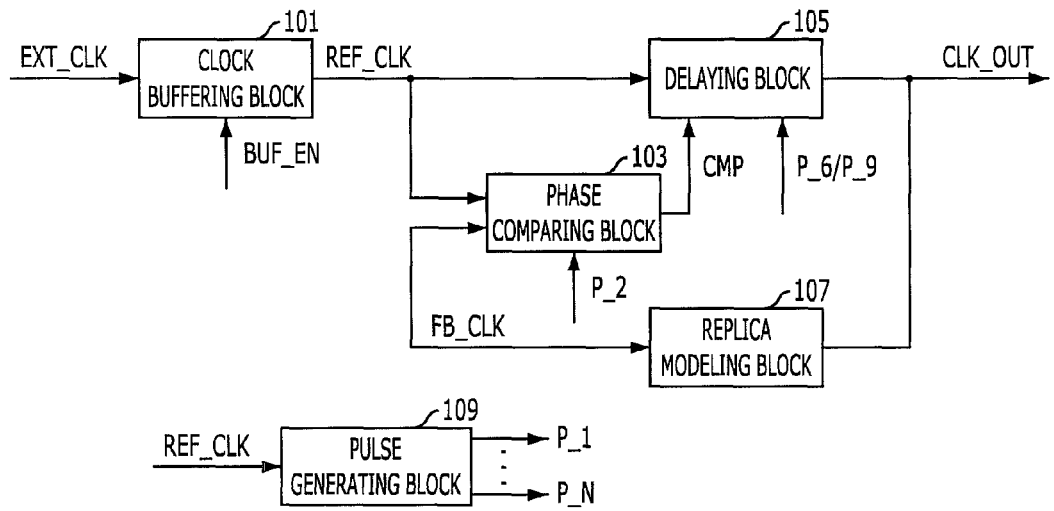
FIG. 1 illustrates a block diagram of a conventional delay locked loop circuit having a single loop structure.
Figure 2:
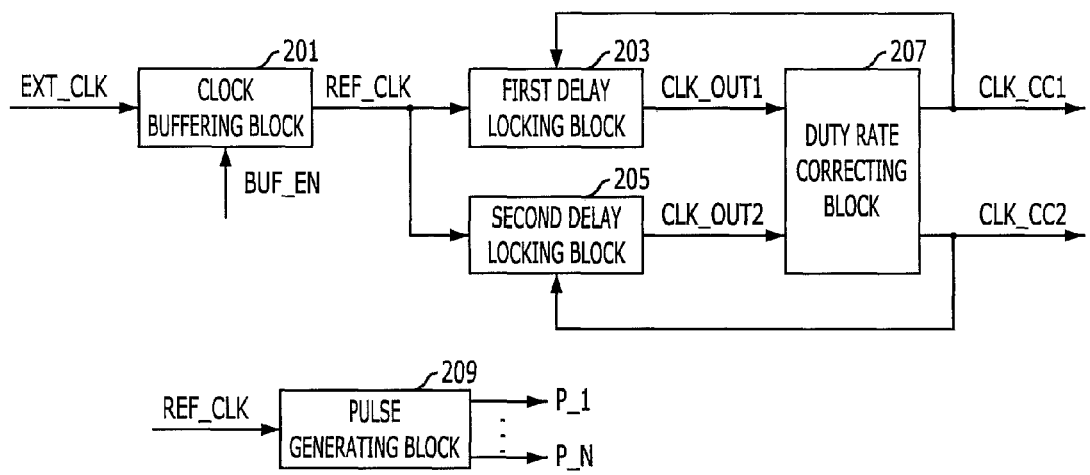
FIG. 2 illustrates a block diagram of a conventional delay locked loop circuit having a dual loop structure.
Figure 3:
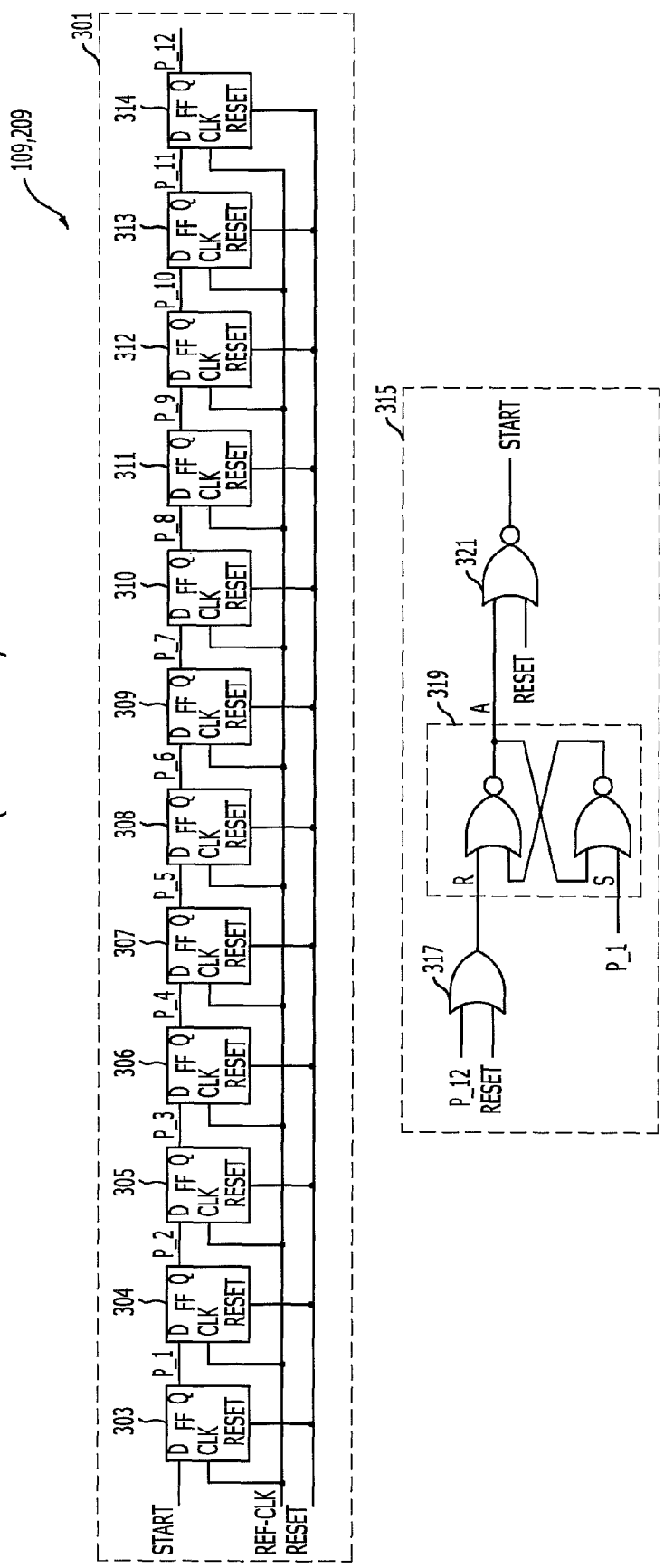
FIG. 3 illustrates a detailed circuit diagram of a pulse generating block described in FIGS. 1 and 2.
Figure 4A:
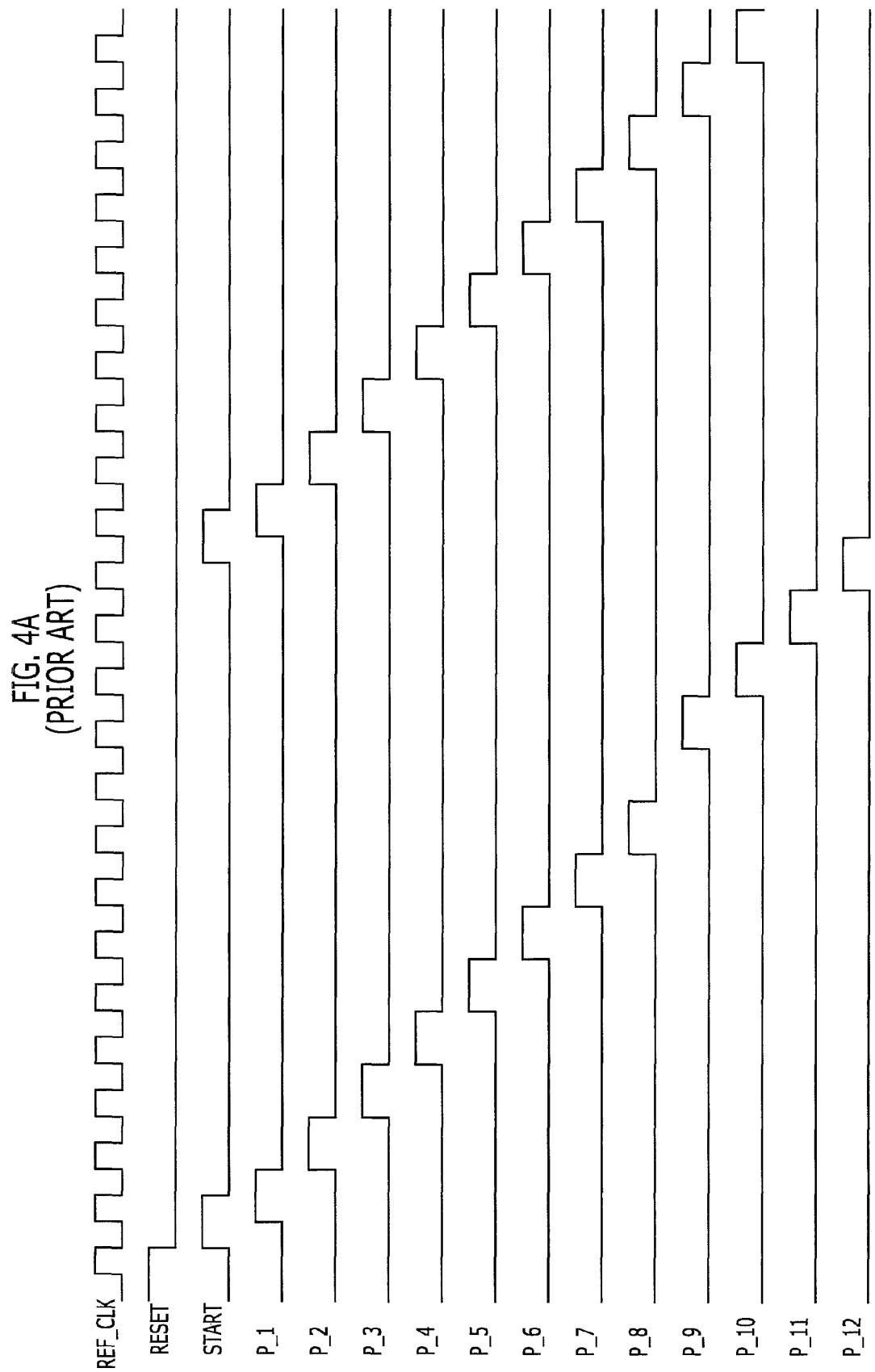
FIGS. 4A and 4B illustrate timing diagrams for the pulse generating block described in FIG. 3.
Figure 4B:
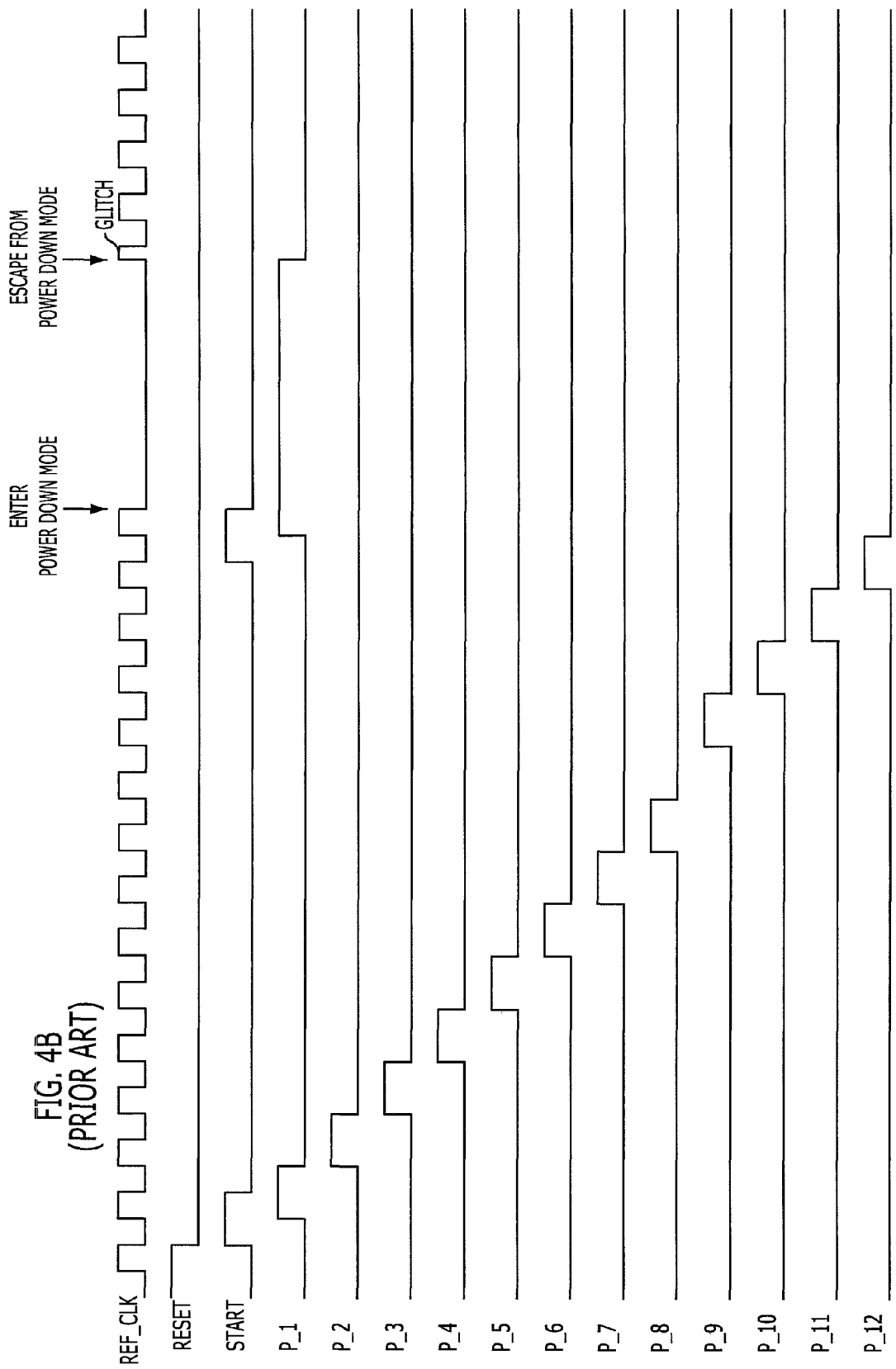
Figure 5:
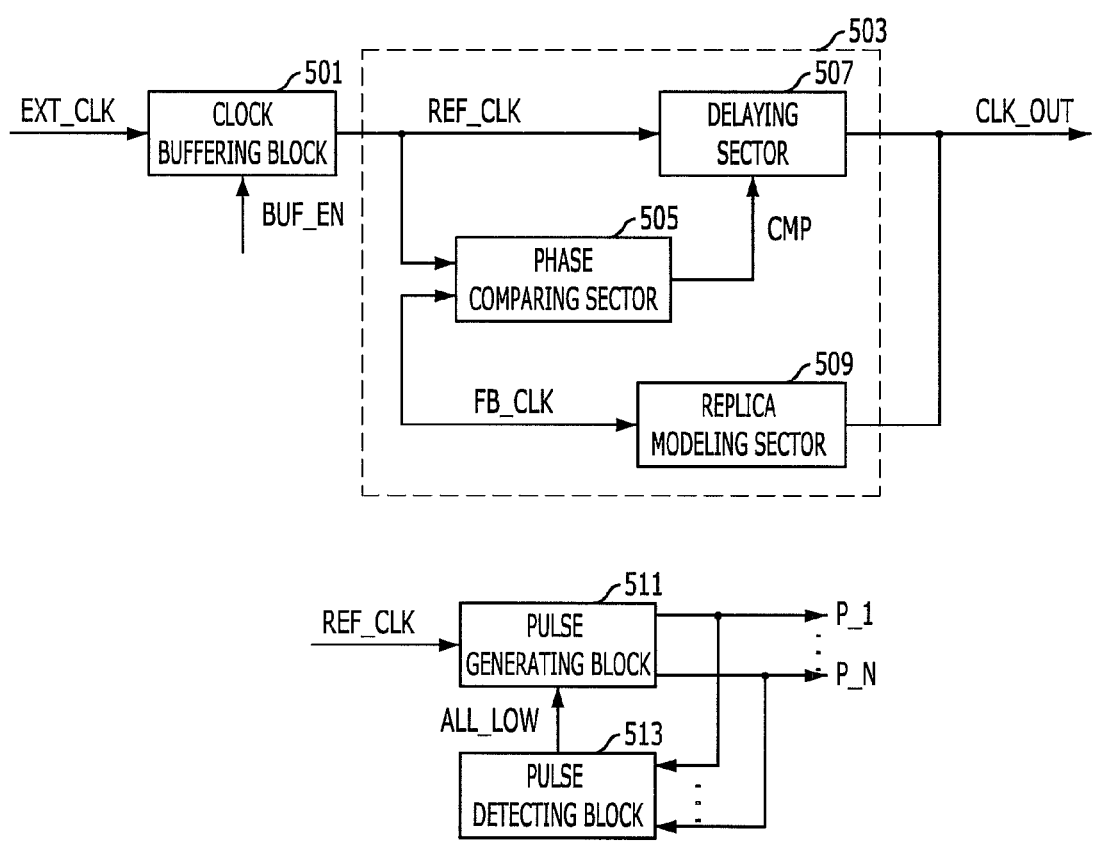
FIG. 5 illustrates a block diagram of a delay locked loop circuit in accordance with an embodiment of the present invention.

FIG. 5 illustrates a block diagram of a delay locked loop circuit in accordance with an embodiment of the present invention.

Referring to FIG. 5, the delay locked loop circuit includes a delay locking block 503 for delaying an input clock REF_CLK and outputting a delayed input clock as an internal clock CLK_OUT to compensate the skew of an external clock EXT_CLK and the internal clock CLK_OUT, a pulse generating block 511 for controlling an operation of the delay locking block 503, sequentially outputting a plurality of pulse signals P_1 to P_N that are shifted by being synchronized with the input clock REF_CLK and enabling one of the plurality of pulse signals P_1 to P_N in response to a detection signal ALL_LOW in response to determining that all of the plurality of pulse signals P_1 to P_N are disabled, and a pulse detecting block 513 for outputting the detection signal ALL_LOW in case all of the plurality of pulse signals P_1 to P_N are disabled.

The delay locked loop circuit may further include a clock buffering block 501 that outputs the input clock REF_CLK by buffering the external clock EXT_CLK and is inactivated in a power down mode.

The delay locked loop circuit includes the pulse detection block 513 unlike the conventional delay locked loop circuit. The pulse detection block 513 detects the case where all of the pulse signals P_1 to P_N outputted from the pulse generating block 511 are disabled and outputs the detection signal ALL_LOW, that is enabled, to the pulse generating block 511 to enable one of the pulse signals P_1 to P_N in case all of the pulse signals P_1 to P_N are disabled by the glitch of the input clock REF_CLK or external noise. Since the pulse signals P_1 to P_N generated from the pulse generating block 511 are generated by shifting their respective previous pulse signals, if one of the pulse signals P_1 to P_N is enabled in response to the detection signal ALL_LOW, the pulse generating block 511 can generate the pulse signals P_1 to P_N that are sequentially enabled again. Accordingly, the delay locking block 503 can sequentially perform a delay locking operation in response to the plurality of pulse signals P_1 to P_N.

Hereinafter, the operation of the delay locked loop circuit in accordance with the present invention will be described in detail.

The delay locking block 503 includes a phase comparing sector 505 for comparing phases of the input clock REF_CLK and a feedback clock FB_CLK to generate a phase comparison signal CMP, a delaying sector 507 for delaying the input clock REF_CLK in response to the phase comparison signal CMP to output the internal clock CLK_OUT and a replica modeling sector 509 for receiving the internal clock CLK_OUT and outputting the feedback clock FB_CLK.

The phase comparing sector 505 compares the input clock REF_CLK and the feedback clock FB_CLK outputted from the replica modeling sector 509 that is obtained by modeling components of delaying a clock inside a semiconductor memory device, thereby outputting the phase comparison signal CMP that includes information for a phase difference of the input clock REF_CLK and the feedback clock FB_CLK to the delaying sector 507.

The delaying sector 507 determines a delay amount in response to the phase comparison signal CMP and outputs the internal clock CLK_OUT by delaying the input clock REF_CLK by the delay amount. The internal clock CLK_OUT is coupled to the replica modeling sector 509. If the phase of the input clock REF_CLK is consistent with that of the feedback clock FB_CLK through the above process, i.e., the delay locking, locking is achieved.

Meanwhile, the clock buffering block 501 disables the input clock REF_CLK in response to a buffer control signal BUF_EN that is enabled when the delay locked loop circuit enters the power down mode. The buffer control signal BUF_EN may be generated from a clock enable signal CKE inputted from a memory controller. According to a device design scheme, the delay locked loop circuit may enter the power down mode by making the external clock EXT_CLK off when the external clock EXT_CLK is inputted to the semiconductor memory device. In this case, the semiconductor memory device may make the external clock EXT_CLK off in response to the clock enable signal CKE and the delay locked loop circuit in accordance with the present invention may output the internal clock CLK_OUT by delaying the external clock EXT_CLK without employing the clock buffering block 501.

The pulse generating block 511 generates the pulse signals P_1 to P_N that are sequentially enabled by being synchronized with the input clock REF_CLK to thereby control the operation of the delay locking block 503, especially, operations of the phase comparing sector 505 and the delaying sector 507. That is, the pulse generating block 511 controls the delaying sector 507 to be activated after the phase comparing sector 505 is activated, so that the delaying sector 507 uses the comparison result of the phase comparing sector 505 and thus the delay locking operation is sequentially performed.

In the meantime, the number or kind of the pulse signals used in the phase comparing sector 505 and the delaying sector 507 may be changed according to the constitution of the phase comparing sector 505 and the delaying sector 507. Furthermore, the number or kind of the pulse signals may be changed according to the constitution of the delay locked loop circuit.

The pulse detecting block 513 outputs the detection signal ALL_LOW, that is enabled, to the pulse generating block 511 in case all of the pulse signals P_1 to P_N are disabled. If one of the pulse signals P_1 to P_N is enabled in response to the detection signal ALL_LOW, the pulse generating block 511 generates the pulse signals P_1 to P_N that are sequentially enabled again. Meanwhile, as the pulse detecting block 513 generates the detection signal ALL_LOW, the pulse generating block 511 enables one of the pulse signals P_1 to P_N that are disabled in response to the detection signal ALL_LOW. Therefore, the pulse detecting block 513 can be considered that it enables one of the pulse signals P_1 to P_N.

Unlike the conventional delay locked loop circuit, the delay locked loop circuit in accordance with the present invention can prevent its malfunction due to external noise or the glitch of a clock since the pulse signals P_1 to P_N can be enabled again although all of the pulse signals P_1 to P_N are disabled.

The detailed operations of the pulse generating block 511 and the detecting block 513 will be described with reference to FIGS. 6 to 9.

Figure 6:
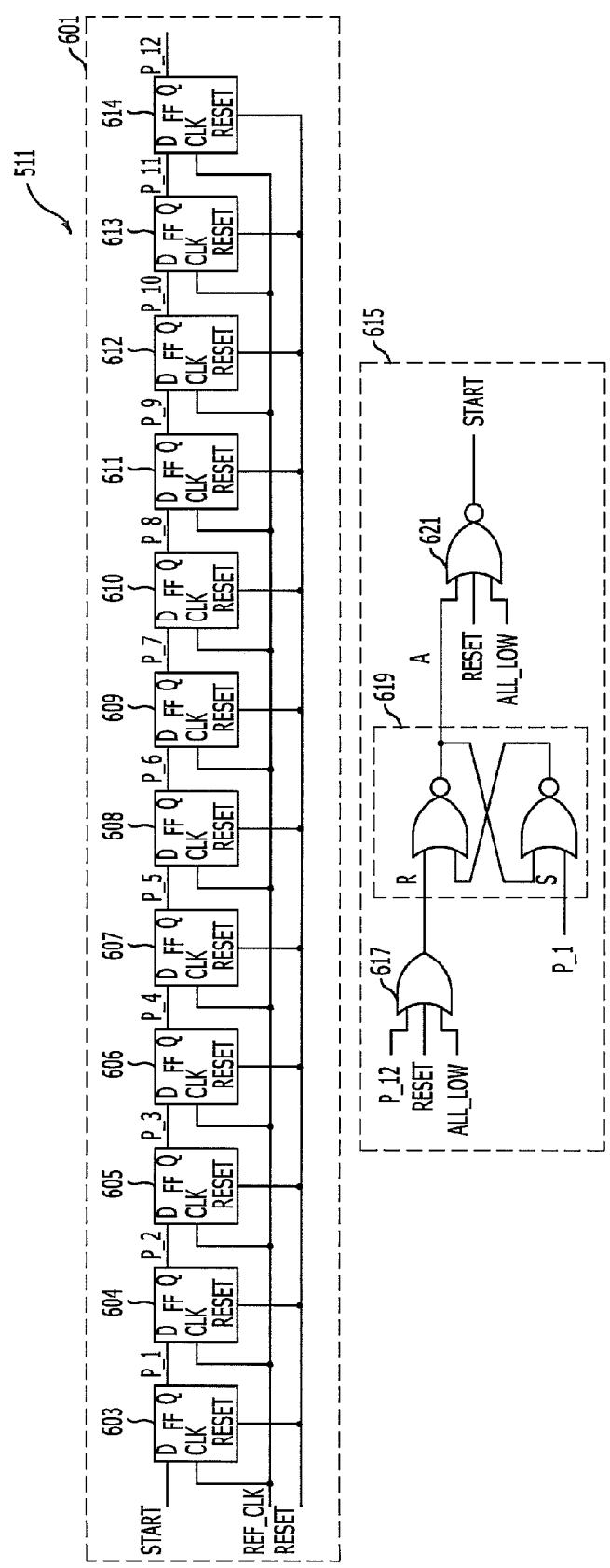
FIG. 6 illustrates a detailed circuit diagram of a pulse generating block described in FIG. 5 in accordance with an embodiment of the present invention.

FIG. 6 illustrates a detailed circuit diagram of the pulse generating block 511 described in FIG. 5 in accordance with an embodiment of the present invention.

Referring to FIG. 6, the pulse generating block 511 includes a shift register 601 for generating the plurality of pulse signals P_1 to P_N by shifting a pulse control signal START and a pulse control sector 615 enables the pulse control signal START for every period of the pulse signals P_1 to P_N and enables the pulse control signal START regardless of the period of the pulse signals P_1 to P_N in response to the detection signal ALL_LOW.

The case where the pulse generating block 511 generates the pulse signals P_1 to P_N, e.g., a first to a twelfth pulse signal P_1 to P_12, by being synchronized with the input clock REF_CLK will be described as an example.

The shift register 601 includes a first to a twelfth flip-flop 603 to 614 that are serially connected to each other and each of which shifts its input signal by one period of the input clock REF_CLK to output a corresponding one of the first to twelfth pulse signals P_1 to P_12. The number of the flip-flops can be changed according to the number of the pulse signals.

The first flip-flop 603 outputs the first pulse signal P_1 that is enabled at a high level by synchronizing the pulse control signal START that is enabled at a high level with a rising edge of the input clock REF_CLK. The first pulse signal P_1 is inputted to the second flip-flop 604. The second flip-flop 604 generates the second pulse signal P_2 that is enabled by shifting the first pulse signal P_1 by one period of the input clock REF_CLK. Similarly, the third to twelfth flip-flops 605 to 614 shift output signals of their previous flip-flops by one period of the input clock REF_CLK and output the shifted signals as the third to the twelfth pulse signals P_3 to P_12 that are sequentially enabled.

The pulse control sector 615 enables the pulse control signal START in response to the twelfth pulse signal P_12 among the first to twelfth pulse signals P_1 to P_12 and disables the pulse control signal START in response to the first pulse signal P_1. That is, since the pulse control sector 615 enables the pulse control signal START for every period of the first to twelfth pulse signals P_1 to P_12, the first to twelfth pulse signals P_1 to P_12 become pulse signals having a predetermined period.

Meanwhile, the pulse control sector 615 enables the pulse control signal START in response to the detection signal ALL_LOW outputted from the pulse detecting block 513 regardless of the period of the first to twelfth pulse signals P_1 to P_12. As described above, since the shift register 601 generates the first to twelfth pulse signals P_1 to P_12 by shifting the pulse control signal START, the first to twelfth pulse signals P_1 to P_12 are sequentially enabled if the pulse control signal START is enabled by the detection signal ALL_LOW. Since the first pulse signal P_1 is enabled if the pulse control signal START is enabled, the detecting block 513 can be considered that it enables the first pulse signal P_1, i.e., one of the first to twelfth pulse signals P_1 to P_12.

As the shift register 601 receives a clock that is obtained by multiplying or dividing the input clock REF_CLK, the period of the first to twelfth pulse signals P_1 to P_12 can be adjusted. For instance, in case the shift register 601 receives a clock that is obtained by dividing the input clock REF_CLK by ½, a pulse width of the first to twelfth pulse signals P_1 to P_12 becomes 2 times of that in case the shift register 601 receives the input clock REF_CLK. Therefore, the period of the first to twelfth pulse signals P_1 to P_12 becomes 2 times compared to that of the input clock REF_CLK.

The pulse control sector 615 includes an OR gate 617, an SR latch 619 and a NOR gate 621. An output signal of the OR gate 617 receiving the twelfth pulse signal P_12, a reset signal RESET and the detection signal ALL_LOW is coupled to an input node R of the SR latch 619. Therefore, the pulse control sector 615 enables the pulse control signal START in response to either the reset signal RESET and the detection signal ALL_LOW. The first pulse signal P_1 is provided to an input node S of the SR latch 619. Since the first to twelfth pulse signals P_1 to P_12 are disabled at a low level before the reset signal RESET is disabled, the reset signal RESET is inputted to the OR gate 617 to establish an initial value of the SR latch 619 and enable the pulse control signal START in the early stage of the operation.

The SR latch 619 makes a logic level of an A node to be a low level in response to an output signal of the OR gate 617 and a logic level of the A node to be a high level in response to the first pulse signal P_1. The SR latch 619 maintains the logic level of the A node to the high level while the first pulse signal P_1 and the twelfth pulse signal P_12 are disabled.

If the reset signal RESET is changed from an enabled state having a high level to a disabled state having a low level, the logic level of the A node is maintained at the low level by the SR latch 619. The pulse control signal START is enabled at the high level after the reset signal RESET is disabled at the low level by the NOR gate 621 receiving the reset signal RESET. The first pulse signal P_1 is enabled at the high level in response to the pulse control signal START that is enabled.

The detection signal ALL_LOW is a pulse signal enabled for a certain period. Therefore, if all of the first to twelfth pulse signals P_1 to P_12 are disabled and thus the detection signal ALL_LOW is enabled to be at the high level and then disabled to be at the low level, the logic level of the A node is maintained to the low level. Accordingly, as in the case where the pulse control sector 615 receives the reset signal RESET, the pulse control signal START is enabled at the high level regardless of the period of the first to twelfth pulse signals P_1 to P_12.

Figure 7:
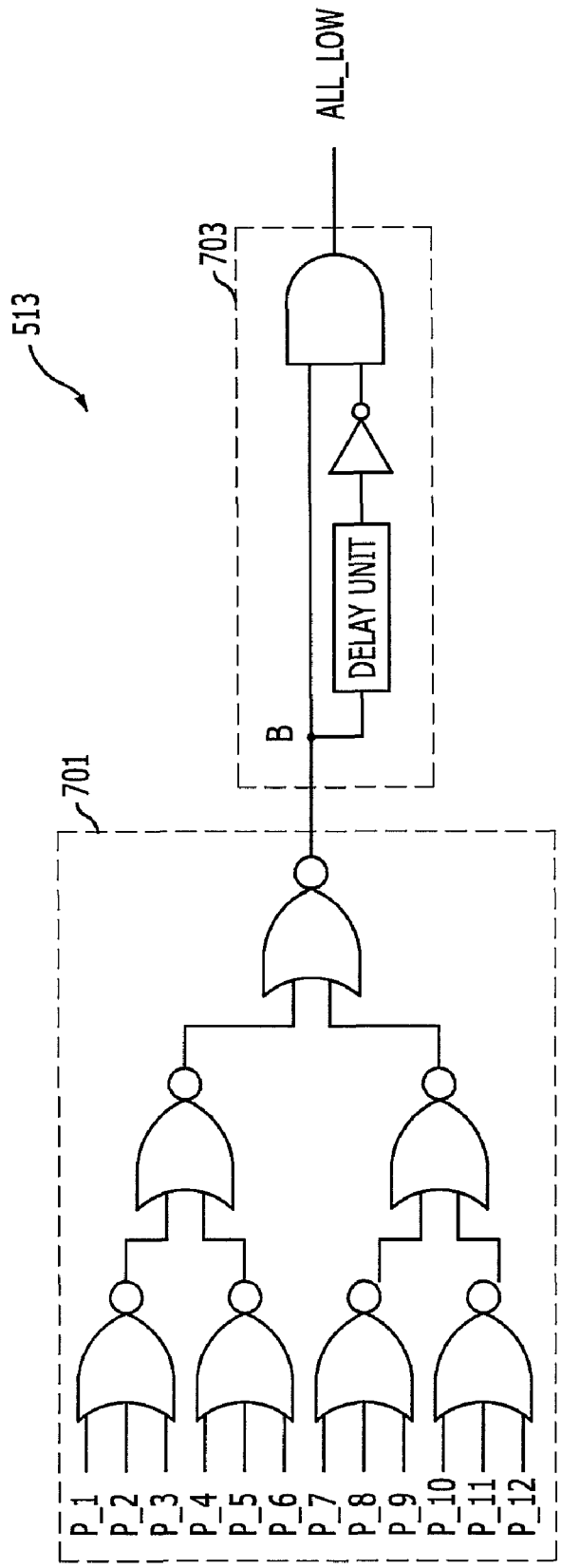
FIG. 7 illustrates a detailed circuit diagram of a pulse detecting block described in FIG. 5 in accordance with an embodiment of the present invention.

FIG. 7 illustrates a detailed circuit diagram of the pulse detecting block 513 described in FIG. 5 in accordance with an embodiment of the present invention.

Referring to FIG. 7, the pulse detecting block 513 includes a detecting sector 701 for detecting whether the first to twelfth pulse signals P_1 to P_12 are disabled or not and an enabling sector 703 for enabling the detection signal ALL_LOW for the certain period, wherein the detection signal ALL_LOW is used to enable one of the first to twelfth pulse signals P_1 to P_12.

The detecting sector 701 includes a plurality of NOR gates or NAND gates receiving the first to twelfth pulse signals P_1 to P_12 and makes a logic level of a B node being a high level in case all of the first to twelfth pulse signals P_1 to P_12 are disabled at the low level. The enabling sector 703 outputs the detection signal ALL_LOW that is a pulse signal enabled at the high level for the certain period if the logic level of the B node becomes the high level.

In case any one of the first to twelfth pulse signals P_1 to P_12 is enabled at the high level, the logic level of the B node is the low level and the enabling sector 703 outputs the detection signal ALL_LOW disabled at the low level.

Figure 8:
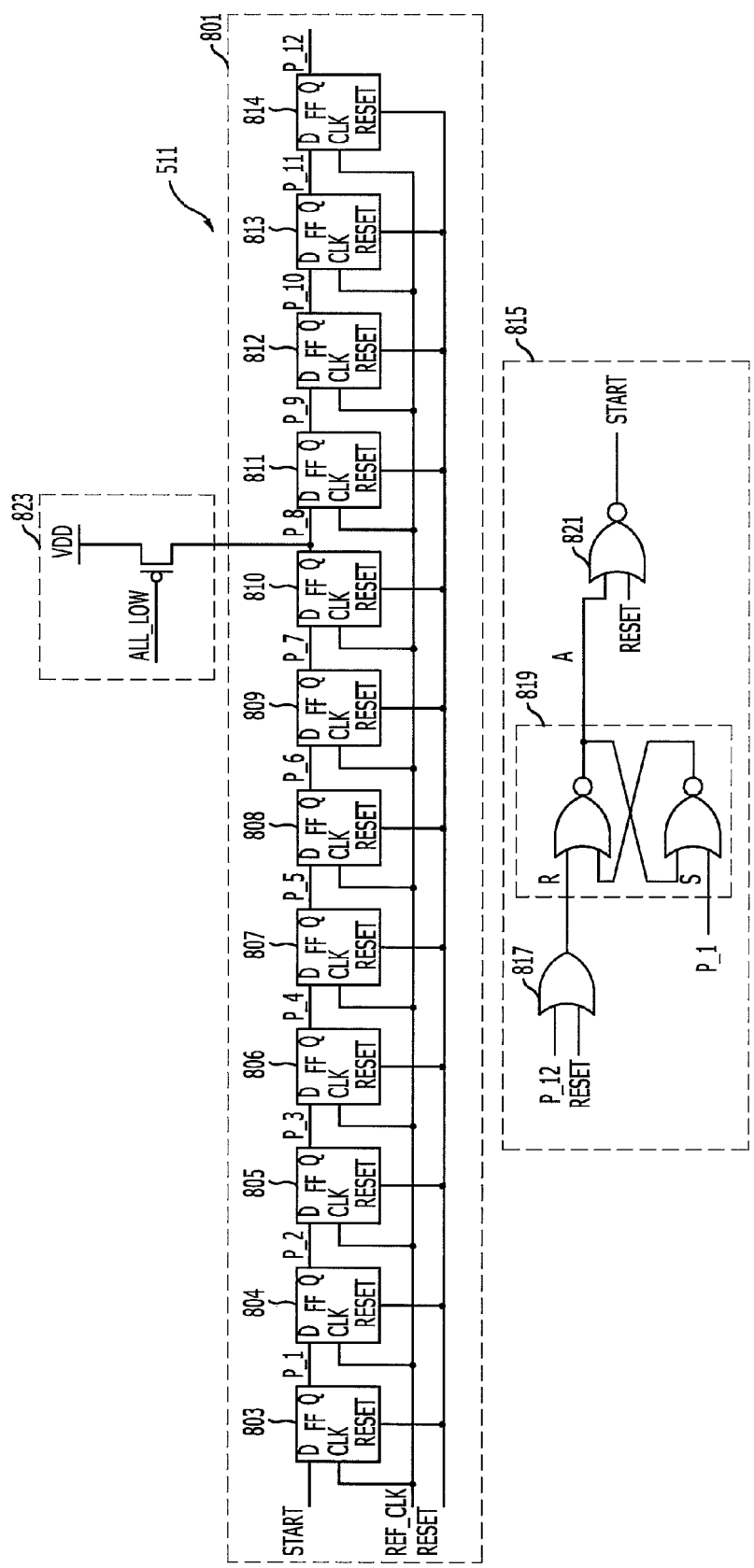
FIG. 8 illustrates a detailed circuit diagram of a pulse generating block described in FIG. 5 in accordance with another embodiment of the present invention.

FIG. 8 illustrates a detailed circuit diagram of the pulse generating block 511 described in FIG. 5 in accordance with another embodiment of the present invention.

Referring to FIG. 8, the pulse generating block 511 includes a shift register 801 including a plurality of flip-flops 803 to 814 serially connected to each other to generate a plurality of pulse signals P_1 to P_12 by shifting the pulse control signal START, a pulse control sector 815 for enabling the pulse control signal START for every period of the pulse signals P_1 to P_12 and a recovering sector 823 for enabling one of output signals of the plurality of flip-flops 803 to 814 in response to the detection signal ALL_LOW.

The construction of the shift register 801 is the same as that of the shift register 601 in FIG. 6. The construction of the pulse control sector 815 is the same as that of the pulse control sector 615 in FIG. 6 except that the pulse control sector 815 does not receive the detection signal ALL_LOW.

The recovering sector 823 enables the eighth pulse signal P_8 that is an output signal of the eighth flip-flop 810 in response to the detection signal ALL_LOW. FIG. 8 shows the recovering sector 823 including a PMOS transistor that is turned on in response to the detection signal ALL_LOW to transfer a supply voltage VDD and enabling the eighth pulse signal P_8 as an example.

In case the recovering sector 823 enables the eighth pulse signal P_8, the ninth flip-flop 811 outputs the ninth pulse signal P_9 by synchronizing the eighth pulse signal P_8 with the input clock REF_CLK. Accordingly, the ninth to twelfth pulse signals P_9 to P_12 are sequentially enabled and the pulse control sector 815 enables the pulse control signal START in response to the twelfth pulse signal P_12. After all, the pulse generating block 511 sequentially enables the first to twelfth pulse signals P_1 to P_12 again.

Figure 9:
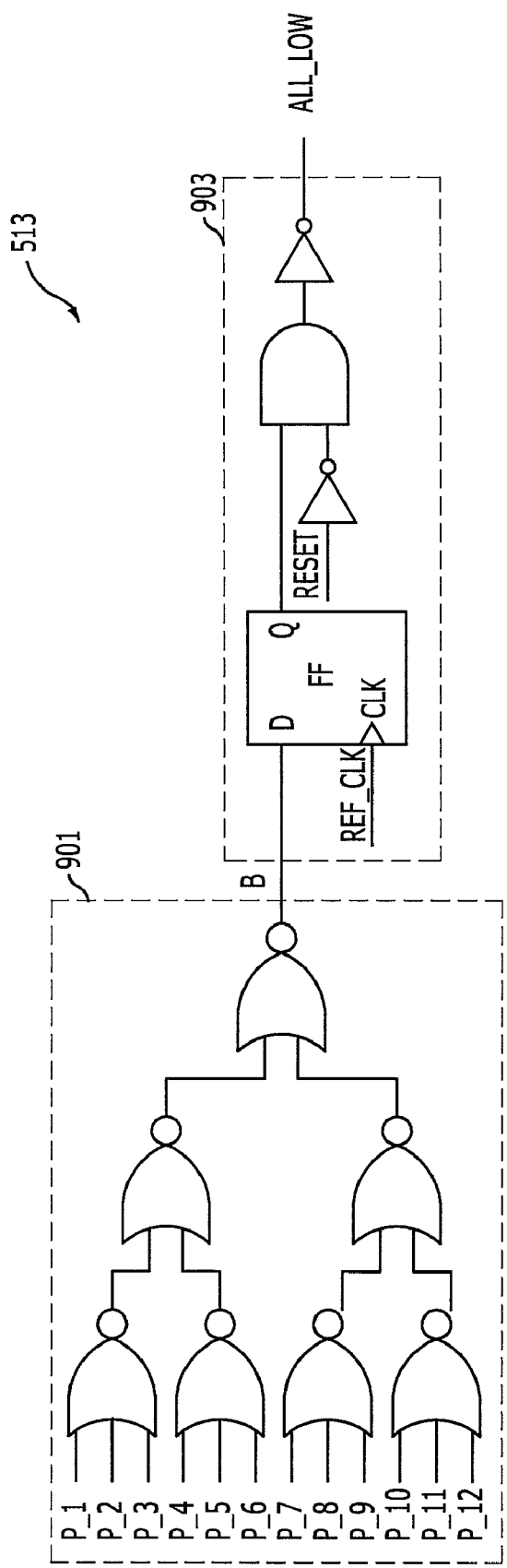
FIG. 9 illustrates a detailed circuit diagram of a pulse detecting block described in FIG. 5 in accordance with another embodiment of the present invention.

FIG. 9 illustrates a detailed circuit diagram of the pulse detecting block 513 described in FIG. 5 in accordance with another embodiment of the present invention.

Referring to FIG. 9, the pulse detecting block 513 includes a detecting sector 901 for detecting whether the first to twelfth pulse signals P_1 to P_12 are disabled or not and an enabling sector 903 for enabling the detection signal ALL_LOW by synchronizing the detection signal ALL_LOW with the input clock REF_CLK, wherein the detection signal ALL_LOW enables one of the first to twelfth pulse signals P_1 to P_12 according to the result of the detecting sector 901.

The construction of the detecting sector 901 is the same as that of the detecting sector 701 in FIG. 7. Unlike the enabling sector 703 in FIG. 7, the enabling sector 903 enables the detection signal ALL_LOW by synchronizing the result of the detecting sector 901 with the input clock REF_CLK. The enabling sector 903 may include a flip-flop as an example.

In case the recovering sector 823 enables the eighth pulse signal P_8 in FIG. 8, since the detecting sector 901 changes a logic level of a B node from the high level to the low level, the detection signal ALL_LOW is not sufficiently enabled at the low level and thus the ninth flip-flop 811 may not latch the eight pulse signal P_8 enabled at a rising edge of the input clock REF_CLK. Therefore, the enabling sector 903 enables the detection signal ALL_LOW by synchronizing the detection signal ALL_LOW with the input clock REF_CLK so that the ninth flip-flop 811 fully latches the eighth pulse signal P_8 that is enabled.

Meanwhile, since the first to twelfth pulse signals P_1 to P_12 are disabled in case the reset signal RESET is enabled at the high level, the logic level of the B node becomes the high level. Accordingly, since the detection signal ALL_LOW is enabled and thus the eighth pulse signal P_8 may be enabled, the enabling sector 903 receives the reset signal RESET and enables the detection signal ALL_LOW only when the reset signal RESET is disabled. Although the case where the enabling sector 903 receives the reset signal RESET is only described as an example, the pulse detection block 513 may be constructed to be activated only when the reset signal REST is disabled by fixing the logic level of the B node of the pulse detecting block 511 to the low level using the reset signal RESET.

Figure 10:
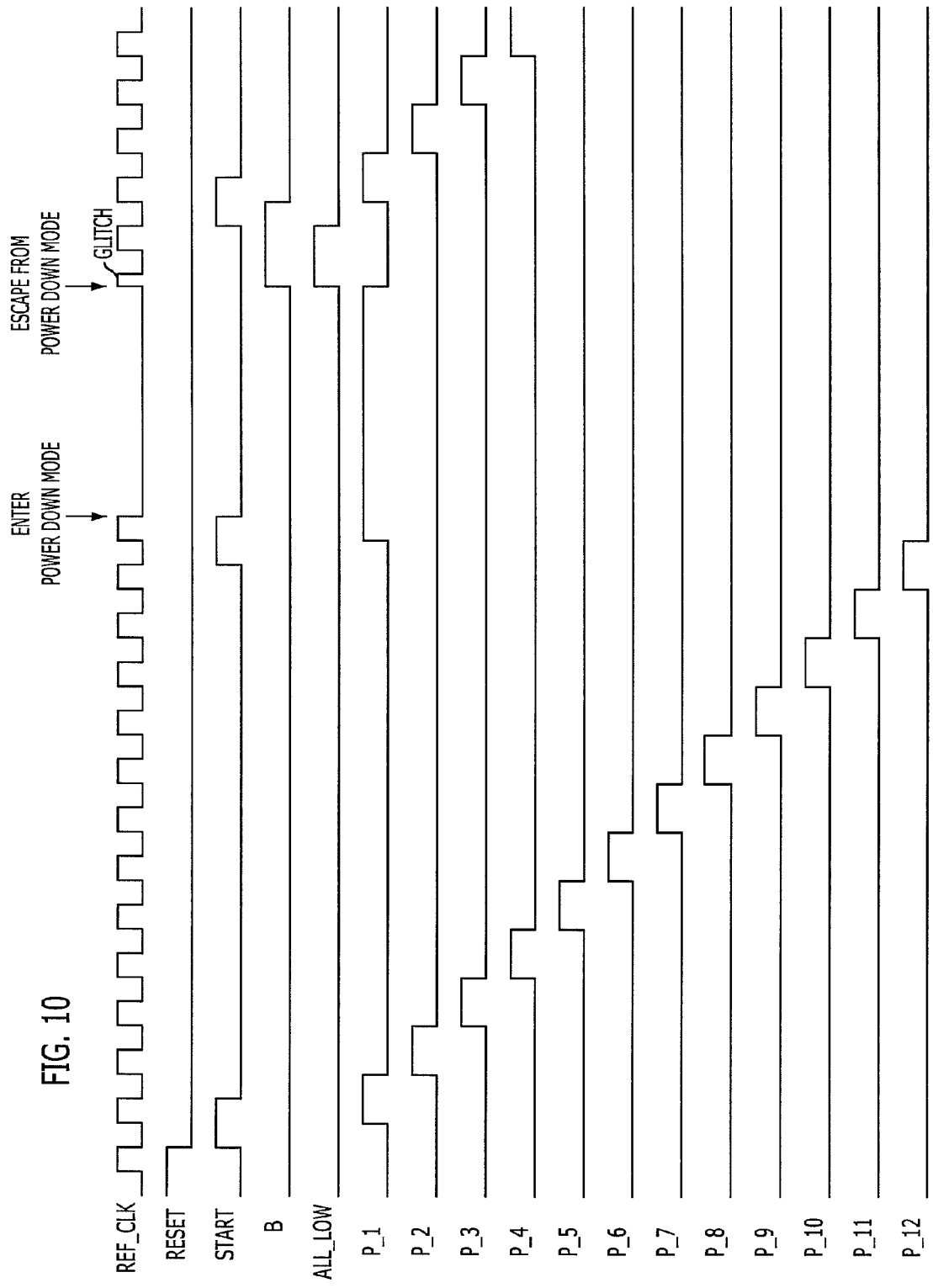
FIG. 10 illustrates a timing diagram for the pulse generating block and the pulse detecting block described in FIGS. 6 and 7, respectively.

FIG. 10 illustrates a timing diagram for the pulse generating block 511 and the pulse detecting block 513 described in FIGS. 6 and 7, respectively. FIG. 10 shows as an example the case where the glitch occurs in the input clock REF_CLK during the process where the delay locked loop circuit exits from the power down mode after entering the power down mode.

Referring to FIG. 10, if the reset signal RESET is disabled to be at the low level from the high level, the pulse control signal START is enabled at the high level by the pulse control sector 615. The shift register 601 generates the first to twelfth pulse signals P_1 to P_12 that are synchronized with the input clock REF_CLK in response to the pulse control signal START and sequentially enabled. The pulse control sector 615 enables the pulse control signal START in response to the twelfth pulse signal P_12 and disables the pulse control signal START in response to the first pulse signal P_1.

The input clock REF_CLK is off when the delay locked loop circuit enters the power down mode and on when the delay locked loop circuit exits from the power down mode. In case the delay locked loop circuit enters the power down mode after the first pulse signal P_1 is enabled, as the input clock REF_CLK is off, the first pulse signal P_1 maintains its enabled state. After then, in case the delay locked loop circuit exits from the power down mode, the glitch may occur in the input clock REF_CLK. Since the operation of the shift register 601 becomes unstable by the glitch, the first flip-flop 603 disables the first pulse signal P_1 in response to the glitch and the second pulse signal P_2 is not enabled in case the second flip-flop 604 does not respond to the glitch.

In this case, that is, the case all of the first to twelfth pulse signals P_1 to P_12 are disabled, the detecting sector 701 makes the logic level of the B node being the high level and the enabling sector 703 outputs the detection signal ALL_LOW of a pulse type that is enabled at the high level. The pulse control sector 615 enables the pulse control signal START to the high level in response to the detection signal ALL_LOW and the shift register 601 sequentially enables the first to twelfth pulse signals P_1 to P_12 in response to the pulse control signal START. Therefore, the delay locked loop circuit in accordance with the present invention can perform the locking operation without the mal-operation although the glitch occurs in the input clock REF_CLK.

In accordance with the present invention, it is possible to prevent the malfunction of the delay locked loop circuit by enabling one of the pulse signals to make the pulse generating block generate the pulse signals that are sequentially enabled in case all of the pulse signals generated from the pulse generating block of the delay locked loop circuit are disabled by the glitch.

While the present invention has been described with respect to the specific embodiments, it will be apparent to those skilled in the art that various changes and modifications may be made without departing from the spirit and scope of the invention as defined in the following claims.

What is claimed is:

1. A delay locked loop circuit, comprising:
   a delay locking block configured to delay an input clock and output the delayed input clock as an internal clock to compensate a skew of an external clock and the internal clock;
   a pulse generating block configured to sequentially output a plurality of pulse signals that control an operation of the delay locking block and enable one of the plurality of pulse signals in response to a detection signal, wherein the plurality of pulse signals is shifted by being synchronized with the input clock; and
   a pulse detecting block configured to output the detection signal in case all of the plurality of pulse signals are disabled.

2. The delay locked loop circuit of claim 1, wherein the pulse detecting block comprises:
   a detecting sector configured to detect whether the plurality of pulse signals are disabled or not; and
   an enabling sector configured to enable the detection signal for a certain period according to the detection result of the detecting sector.

3. The delay locked loop circuit of claim 2, wherein the pulse generating block comprises:
   a shift register configured to generate the plurality of pulse signals by shifting a pulse control signal; and
   a pulse control sector configured to enable the pulse control signal for every period of the plurality of pulse signals and enable the pulse control signal regardless of the period of the plurality of pulse signals in case the detection signal is disabled after the certain period.

4. The delay locked loop circuit of claim 1, wherein the pulse detecting block comprises:
   a detecting sector configured to detect whether the plurality of pulse signals is disabled or not; and
   an enabling sector configured to enable the detection signal by synchronizing the detection signal with the input clock according to the detection result of the detecting sector.

5. The delay locked loop circuit of claim 4, wherein the pulse generating block comprises:
   a shift register including a plurality of flip-flops that is serially connected to each other and generates the plurality of pulse signals by shifting a pulse control signal;
   a pulse control sector configured to enable the pulse control signal for every period of the plurality of pulse signals; and
   a recovering sector configured to enable one of output signals of the plurality of flip-flops in response to the detection signal.

6. The delay locked loop circuit of claim 5, wherein the recovering sector comprises a transistor that is turned on in response to the detection signal.

7. The delay locked loop circuit of claim 3, wherein the pulse control sector is configured to enable the pulse control signal in response to the last pulse signal among the plurality of pulse signals and disable the pulse control signal in response to the first pulse signal among the plurality of pulse signals.

8. The delay locked loop circuit of claim 3, wherein the pulse control sector is configured to enable the pulse control signal if a reset signal is disabled.

9. The delay locked loop circuit of claim 1, wherein the pulse detecting block is configured to be activated if a reset signal is disabled.

10. The delay locked loop circuit of claim 1, wherein the input clock is disabled when entering a power down mode and enabled when escaping from the power down mode.

11. The delay locked loop circuit of claim 1, wherein the delay locking block comprises:
    a phase comparing sector configured to compare a phase of the input clock with that of a feedback clock and output a phase comparison signal;
    a delaying sector configured to delay the input clock in response to the phase comparison signal to thereby output the internal clock; and
    a replica modeling sector configured to receive the internal clock and output the feedback clock.

12. The delay locked loop circuit of claim 11, wherein the phase comparing sector and the delaying sector are sequentially activated in response to the plurality of pulse signals.

13. The delay locked loop circuit of claim 1, further comprising a clock buffering block configured to output the input clock by buffering the external clock and be inactivated in a power down mode.

14. A delay locked loop circuit, comprising:
    a delay locking block configured to delay an input clock and output the delayed input clock as an internal clock;
    a pulse generating block comprising a shift register and configured to sequentially output a plurality of pulse signals that are shifted in the shift register and control an operation of the delay locking block, wherein a pulse signal of the plurality of pulse signals is enabled in response to a detection signal; and
    a pulse detecting block configured to output the detection signal when all of the plurality of pulse signals are disabled.

15. The delay locked loop circuit of claim 14, wherein the pulse detecting block comprises:
    a detecting sector configured to detect whether the plurality of pulse signals are disabled or not; and
    an enabling sector configured to enable the detection signal for a certain period according to the detection result of the detecting sector.

16. The delay locked loop circuit of claim 14, wherein the pulse generating block comprises:
    the shift register configured to generate the plurality of pulse signals by shifting a pulse control signal; and
    a pulse control sector configured to enable the pulse control signal when the detection signal is disabled.

17. The delay locked loop circuit of claim 14, wherein the pulse detecting block is configured to be activated when a reset signal is disabled.

* * * * *